(12) United States Patent
Tamaki et al.

(10) Patent No.: US 6,396,264 B1
(45) Date of Patent: May 28, 2002

(54) TRIPLATE STRIPLINES USED IN A HIGH-FREQUENCY CIRCUIT AND A SHIELDED-LOOP MAGNETIC FIELD DETECTOR

(75) Inventors: Naoya Tamaki; Norio Masuda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/665,676

(22) Filed: Sep. 20, 2000

(30) Foreign Application Priority Data

Sep. 29, 1999 (JP) .......................................... 11-276872

(51) Int. Cl.⁷ ............................................... G01R 33/02
(52) U.S. Cl. ...................................... 324/249; 343/841
(58) Field of Search ................................. 324/249, 257, 324/258, 260; 716/15; 336/84 M; 343/841

(56) References Cited

U.S. PATENT DOCUMENTS 5,070,737 A * 12/1991 Reilly ..................... 73/862.04
5,592,391 A * 1/1997 Muyshondt et al. .......... 716/15

FOREIGN PATENT DOCUMENTS

| JP | 58-117701 | 7/1983 |
| JP | 9-283930 | 10/1997 |
| JP | 11-72545 | 3/1999 |
| JP | 2000-171504 | 6/2000 |

* cited by examiner

*Primary Examiner*—Edward Lefkowitz
*Assistant Examiner*—Subhash Zaveri
(74) *Attorney, Agent, or Firm*—McGinn & Gibb, PLLC

(57) ABSTRACT

A triplate stripline on a multilayer circuit board includes an inner conductor sandwiched between two ground patterns having a finite pattern width that is 10 times the pattern width of said inner conductor or less. The two ground patterns are short-circuited on opposite transverse ends thereof by a plurality of vias disposed in a longitudinal direction which is a signal transmitting direction of the stripline. An adjacent stripline is of the same structure as the triplate stripline. Each of the striplines has a cross-sectional shape in which one inner conductor is surrounded by the two ground patterns and the vias on the opposite sides. The inner conductor is thus prevented from suffering ambient electromagnetic noise and electromagnetic interference such as crosstalk or the like.

21 Claims, 9 Drawing Sheets

TRIPLATE STRIPLINES USED IN A HIGH-FREQUENCY CIRCUIT AND A SHIELDED-LOOP MAGNETIC FIELD DETECTOR

BACKGROUND OF THE INVENTION

1. Field of the Invention

The present invention relates to a high-frequency circuit including a stripline, and more particularly to a stripline structure with an enhanced shielding capability for suppressing ambient electromagnetic noise and electromagnetic interference such as crosstalk, and a magnetic field detector incorporating such a stripline structure.

2. Description of the Related Art

High-frequency circuits tend to cause characteristic degradation because of electromagnetic wave interference between a plurality of circuit components and transmission lines that interconnect the circuit components. Therefore, various efforts have been made to provide electromagnetic shields in high-frequency circuits that are liable to radiate unwanted electromagnetic waves or suffer external electromagnetic waves by using metal casings and metal patterns on printed-circuit boards.

In order to increase the shieldability of transmission paths, microstrip lines having metal strips exposed on the surface layer may be changed to triplate striplines which have a metal strip as an inner layer sandwiched between upper and lower ground layers. The triplate striplines are less susceptible to at least direct electromagnetic radiations from mounted circuit components and external electromagnetic waves, and contribute to minimizing overall circuit characteristic deterioration.

However, even triplate striplines fail to provide a complete shielding capability as they suffer crosstalk between adjacent striplines in the same layer. According to one solution, as shown in FIG. 1 of the accompanying drawings, upper and lower ground layers 2002 are electrically connected to each other by vias 2003 on opposite sides of an inner conductor 2001 in surrounding relationship to the inner conductor 2001. These vias are provided in a plurality in the direction of the transmission path for increased isolation from an adjacent stripline.

Although triplate striplines are less advantageous than microstrip lines in terms of the mounting of circuit components, it is effective to apply highly shielded triplate striplines if spaced circuit components reed to be interconnected over a relatively long distance. Consequently, it is advisable to use microstrip lines in the vicinity of mounted circuits and use triplate striplines to interconnect circuit components over a relatively long distance.

For connecting a high-frequency circuit module which comprises a multilayer circuit board to another spaced high-frequency circuit module which comprises a multilayer circuit board, it is often customary to use highly shielded transmission paths such as coaxial lines between transmission and reception terminals of those high-frequency circuit modules.

FIG. 2 of the accompanying drawings shows a simplest way of connecting a coaxial line to a stripline on a multilayer circuit board.

As shown in FIG. 2, a triplate stripline 2103 has an inner conductor 2101 sandwiched between two ground patterns 2102 in a multilayer circuit board 2100. The inner conductor 2101 is electrically connected through a via 2104 to a pad 2106 of certain area on an uppermost layer 2105. The pad 2106 is electrically joined to a central conductor 2108 of a coaxial line 2107 by a solder body 2109 or the like. The ground layers 2102 are electrically connected through vias 2110 to a pad 2111 on the uppermost layer 2105, which is electrically joined to an outer conductor 2112 of the coaxial line 2107 by a solder body 2113 or the like.

An application for patent has been filed for a shielded-loop magnetic field detector using such a triplate stripline (see Japanese patent application No. 10-346030). FIG. 3 of the accompanying drawings shows the disclosed shielded-loop magnetic field detector using a triplate stripline.

As shown in FIG. 3, an inner conductor 2202 is disposed on an unexposed layer of a multilayer circuit board 2201 which comprises at least three layers, and upper and lower ground patterns 2203 are disposed above and below the inner conductor 2202 with insulators interposed therebetween, thus providing a triplate stripline 2204. An insulator may be disposed on the upper surface of the upper ground pattern, or the lower surface of the lower ground pattern, or both for the purpose of increasing the mechanical strength of the multilayer circuit board 2201.

On each of the ground patterns 2203, the stripline 2204 includes a lead 2205 extending as a straight portion from the left end and a loop 2206 bent at a right angle into a square shape on a right-hand side of the lead 2205. The loop 2206 has a terminal end 2207 short-circuited to the ground pattern 2203 of the stripline 2204. The loop 2206 has a gap 2208 defined in the right end thereof, and includes a square loop opening 2209 defined therein.

The inner conductor 2202 has a portion positioned at first half portions 2210 of the loops 2206, extending across the gaps 2208, and electrically connected through a via 2211 to the ground patterns 2203 at second half portions 2212 of the loops 2206.

With the above structure, an output produced by a magnetic field that crosses the loop openings 2209 is propagated as a stripline mode to the left ends of the leads 2205.

Since the inner conductor of the triplate stripline is sandwiched between the upper and lower ground layers, as described above, the inner conductor is highly shielded vertically by the ground layers, but not horizontally because it is open horizontally. Even if the triplate stripline is used to interconnect circuit components, therefore, it fails to provide a complete electromagnetic shield. It has heretofore been considered to be effective to employ wide upper and lower ground layers in order to increase the shielded capability of the inner conductor.

As shown in FIG. 1, the upper and lower ground patterns are electrically connected to each other by the vias on opposite sides of the inner conductor in surrounding relationship to the inner conductor to increase isolation from an adjacent stripline for thereby solving, to a certain extent, the problem of crosstalk between adjacent striplines in the same layer. However, if the electromagnetic field is disturbed in the vicinity of the vias, then electromagnetic interference occurs between the adjacent striplines, and hence the isolation from the adjacent stripline is not necessarily sufficient.

As shown in FIG. 2, if the stripline and the coaxial line are connected to each other, then since the central conductor 2108 of the coaxial line is exposed, it is likely to be affected by the electromagnetic field generated by nearby circuit components and interconnections. Furthermore, if the board and the coaxial line are stressed by an external action, then the sold bodies and metal patterns tend to be peeled off, resulting in poor electric connections.

If a printed-circuit board is positioned on the right-hand side of the conventional shielded-loop magnetic field detector using a triplate stripline as shown in FIG. 3 and a magnetic field near the PCB interconnections is to be detected by the magnetic field detector, then since the electromagnetic field near the PCB where a number of circuit components are mounted and connected by highly dense interconnections is not uniform, but highly disturbed, it is difficult for the shielded-loop magnetic field detector that is positioned in the disturbed electromagnetic field to detect only the desired magnetic field.

Furthermore, as described above, the inner conductor sandwiched between the upper and lower ground patterns is highly shielded vertically by the ground layers, but not horizontally because it is open horizontally. If there is a disturbed electromagnetic field near a printed-circuit board, the magnetic field detector tends to detect the unwanted electromagnetic field other than the desired magnetic field, and hence suffers poor measurement accuracy.

SUMMARY OF THE INVENTION

It is therefore an object of the present invention to provide a high-frequency circuit including a stripline with an increased shielding capability for suppressing the effect of ambient electromagnetic noise and electromagnetic interference such as crosstalk.

Another object of the present invention is to provide a shielded-loop magnetic field detector using a triplate stripline with an increased shielding capability.

According to an aspect of the present invention as described in claims 1 and 2, a high-frequency circuit includes a triplate stripline on a multilayer circuit board, the triplate stripline comprising an inner conductor sandwiched between two ground patterns having a finite pattern width greater than a pattern width of the inner conductor. The ground patterns are short-circuited to each other on opposite transverse ends thereof by a plurality of vias disposed in a longitudinal direction which is a signal transmitting direction of the stripline. In a cross section including the vias, the inner conductor is surrounded by the two ground patterns and the vias on the opposite sides thereof.

As a result, a ground current in the triplate stripline and a ground current in an adjacent stripline do not interfere with each other. Any electromagnetic interference with the high-frequency circuit is reduced, and the shielding capability of the high-frequency circuit is increased. The triplate stripline is prevented from suffering resonance which would otherwise occur in the entire multilayer circuit board due to solid plane power supply and ground patterns operating as resonators frequently on conventional multilayer circuit boards.

The high-frequency circuit as described in claims 3 and 4 may further include a coaxial line disposed on an uppermost layer of the multilayer circuit board. The coaxial line may comprise a central conductor exposed front a tip end thereof, inserted into a through hole of a via which is defined in the uppermost layer of the multilayer circuit board and electrically connected to the inner conductor of the stripline, and electrically connected by a solder body, and an outer conductor exposed near the tip end thereof and electrically connected by a solder to a metal pattern which is electrically connected to the ground patterns of the stripline. With this arrangement, connection failures between the stripline and the coaxial line can be reduced. Since the central conductor of the coaxial line is nearly directly connected to the inner conductor of the stripline, there is achieved a connection that is of excellent high frequency characteristics and provides high matching over a wide frequency range.

The high-frequency circuit as described in claims 5 and 6 may further include a metal casing which shields the ground pattern and the exposed central conductor on the uppermost layer of the multilayer circuit board. The metal casing may be held in close contact with and electrically connected to one of the ground layers of the stripline and the outer conductor of the coaxial line by a solder body, and fastened to the multilayer circuit board from opposite sides thereof by a bolt and a nut. Because the exposed central conductor of the coaxial line is surrounded by the conductor or metal casing, the central conductor is highly shielded. The metal casing provides increased mechanical strength for keeping the multilayer circuit board and the coaxial line stably connected against stresses applied thereto.

According to another aspect of the present invention as described in claims 7 to 14, there is provided a shielded-loop magnetic field detector comprising a triplate stripline which includes a lead and a loop. The triplate stripline is of the structure described above. When an output produced by a magnetic field detected by the loop is propagated as a stripline mode to the lead, because the shielding capability of the stripline is increased, a leakage of the propagated mode and the effect of ambient noise are reduced.

Even if the loop as a magnetic field detector is positioned closely to an object which exhibits a complex electromagnetic field distribution, since the loop is highly shielded, the effect of an unwanted electromagnetic field other than a desired magnetic field to be measured is reduced, and the shielded-loop magnetic field detector can measure magnetic fields highly reliably.

According to the present invention as described in claims 15 to 18, the two ground patterns at the second half portion which is free of the inner conductor may be short-circuited to each other at a transverse center thereof by a plurality of vias arranged along the second half portion.

When an output produced by a magnetic field detected by the loop is propagated as a stripline mode to the lead, because the shielding capability of the stripline is increased, a leakage of the propagated mode and the effect of ambient noise are reduced. Even if the loop as a magnetic field detector is positioned closely to an object which exhibits a complex electromagnetic field distribution, since the loop is highly shielded, the effect of an unwanted electromagnetic field other than a desired magnetic field to be measured is reduced, and the shielded-loop magnetic field detector can measure magnetic fields highly reliably.

Furthermore, since the two ground patterns at the second half portion of the loop which is free of the inner conductor are short-circuited at the opposite transverse ends and the transverse center through the vias, the impedance of the ground patterns is reduced for stable magnetic field measurement. The magnetic field detector is free of characteristics deterioration which would otherwise be caused by an unwanted mode produced by an unwanted electromagnetic field entering between the two ground patterns from the object being measured.

The above objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
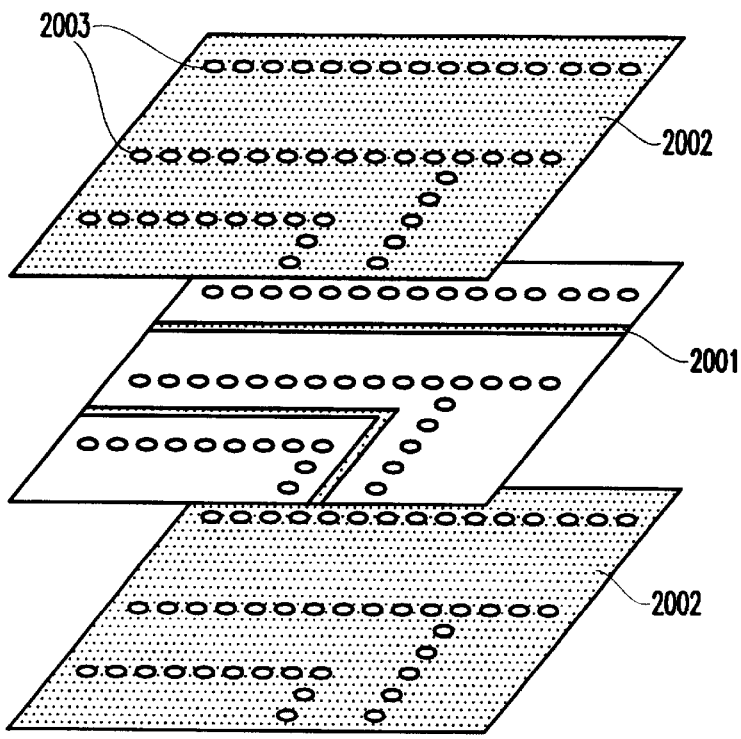
FIG. 1 is an exploded perspective view of a conventional triplate stripline.
Figure 2:
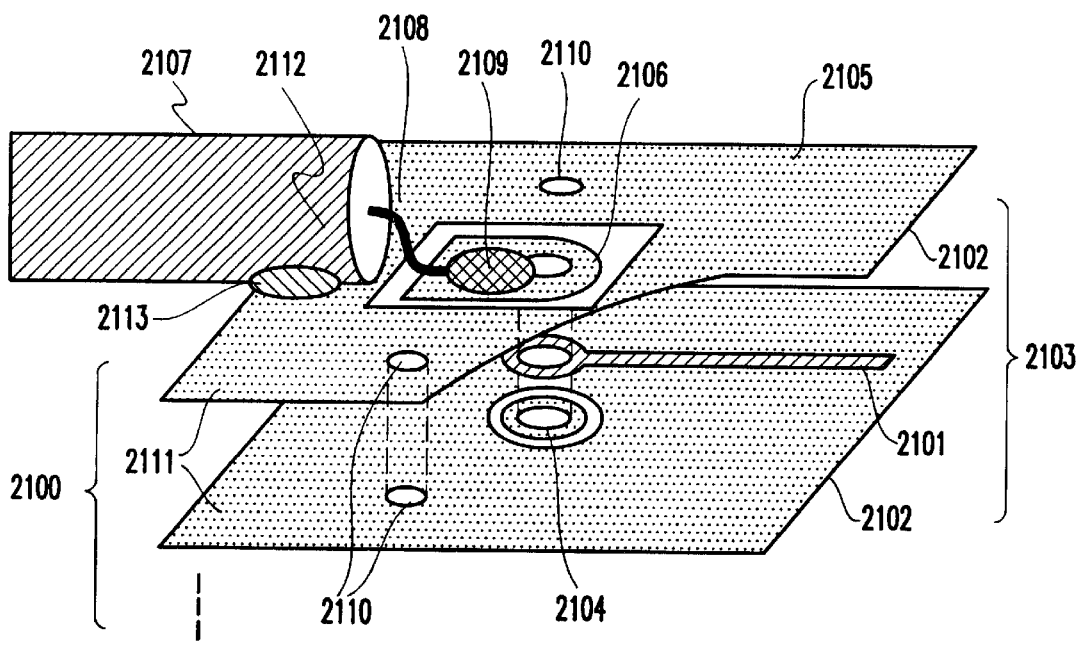
FIG. 2 is an exploded perspective view of a conventional triplate stripline connected to a coaxial line.
Figure 3:
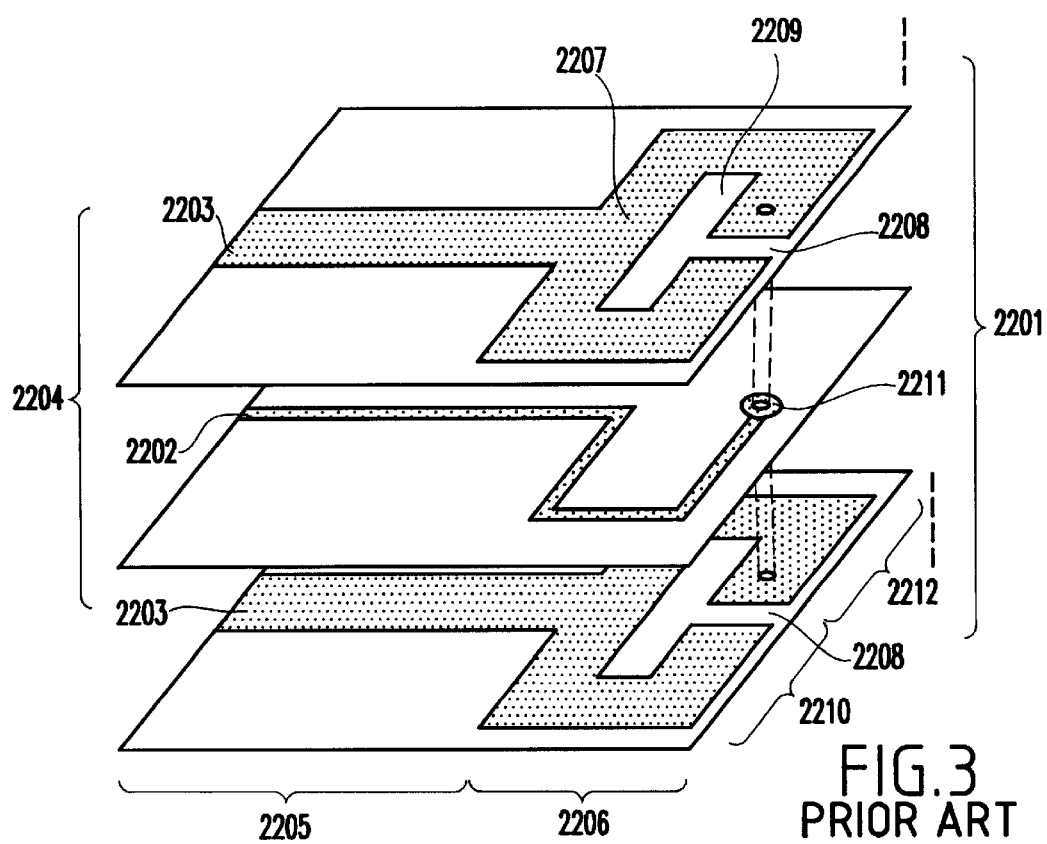
FIG. 3 is an exploded perspective view of a shielded-loop magnetic field detector using a triplate stripline.
Figure 4:
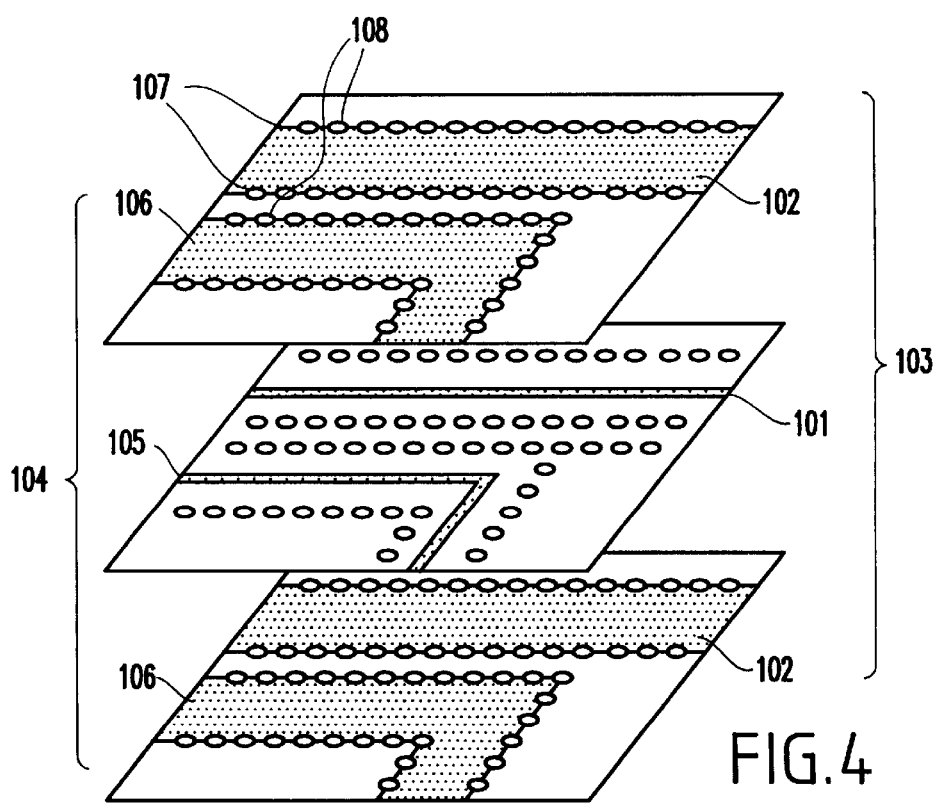
FIG. 4 is an exploded perspective view of a high-frequency circuit according to a first embodiment of the present invention.

FIG. 4 shows in exploded perspective a high-frequency circuit according to a first embodiment of the present invention. As shown in FIG. 4, the high-frequency circuit has an inner conductor 101 disposed on an unexposed layer of a multilayer circuit board which comprises at least three layers, and ground patterns 102 disposed above and below the inner conductor 101 with insulators interposed therebetween, thus providing a triplate stripline 103.

The inner conductor 101 comprises a thin metal line or metal film having a certain width, and each of the ground patterns 102 disposed above and below the inner conductor 101 comprises a metal pattern having a finite width that is 10 times the width of the inner conductor 101 or less. The two ground patterns 102 have the same width. The ground layers 102 are not shared by an overall printed-circuit board or a transmission path such as an adjacent stripline 104 or a high-frequency circuit.

Similarly, an inner conductor 105 of the adjacent stripline 104 comprises a thin metal line or metal film having a certain width, and each of ground patterns 106 disposed above and below the inner conductor 105 comprises a metal pattern having a finite width that is 10 times the width of the inner conductor 105 or less. The two ground patterns 106 have the same width.

Ground currents of the striplines 103, 104 that are disposed adjacent to each other do not interfere with each other, and the striplines 103, 104 are prevented from electromagnetically interfering with each other, and hence have an increased shielding capability. For example, the striplines 103, 104 are prevented from suffering resonance which would otherwise occur in the entire multilayer circuit board due to solid plane power supply and ground patterns operating as resonators frequently on conventional multilayer circuit boards.

In order to further increase the shielding capability with the ground layers 102 being of a finite width, opposite transverse ends of the ground patterns 102 are electrically short-circuited to each other by vias 107. The vias 107 are provided in a plurality at the opposite transverse ends of the ground layers 102 in a longitudinal direction that is the signal transmitting direction of the stripline 103. The vias 107 may be transversely positioned such that they have circular edges partially or wholly connected to the ground patterns, but preferably the vias 107 should be transversely positioned symmetrically with respect to the inner conductor 101.

The vias 107 should preferably be longitudinally positioned such that the distance or pitch between them and adjacent vias 108 be ⅙ or less of the wavelength of transmitted signals. Since the vias for making the adjacent striplines highly isolated from each other are independently provided, undesired electromagnetic interference between the striplines is reduced, and their shielding capability is increased.

Figure 5:
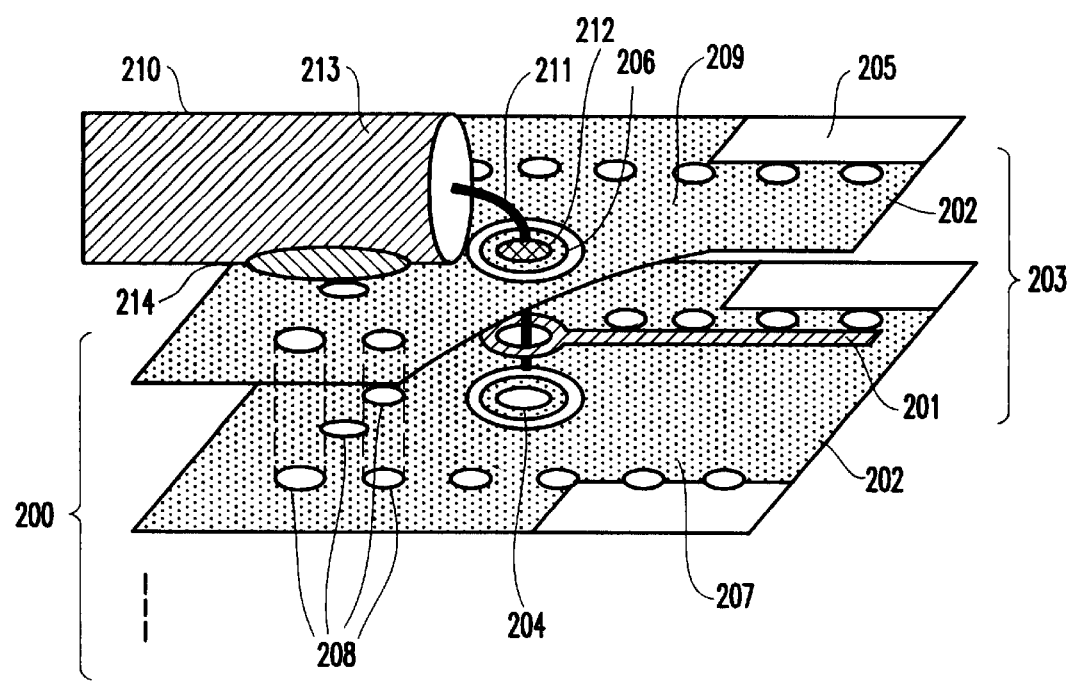
FIG. 5 is an exploded perspective view of a high-frequency circuit according to a second embodiment of the present invention.

FIG. 5 shows in exploded perspective a high-frequency circuit according to a second embodiment of the present invention. The high-frequency circuit according to the second embodiment is directed to a structure in which the stripline according to the first embodiment and a coaxial line are connected to each other.

As shown in FIG. 5, the high-frequency circuit has an inner conductor 201 disposed on an unexposed layer of a multilayer circuit board 200 which comprises at least three layers, and ground patterns 202 disposed above and below the inner conductor 201 with insulators interposed therebetween, thus providing a triplate stripline 203.

The inner conductor 201 has a longitudinal end electrically connected through a via 204 to a pad 206 on an uppermost layer 205. Similarly, the ground layer 207 has a longitudinal end electrically connected through a via 208 to the ground pattern 209, i.e., the uppermost layer 205, so that the two ground layers are electrically connected to each other. In order to increase the shielding capability for the inner conductor 201, a plurality of vias 208 are provided around the via 204 of the inner conductor 201.

A coaxial line 210 has an outer conductor and an insulator removed for a suitable length from a longitudinal tip end thereof, leaving only a central conductor 211. The coaxial line 210 comprises a semirigid coaxial cable, for example. The coaxial line 210 is placed on and parallel to the uppermost layer 205 of the multilayer circuit board. The tip end of the central conductor 211 of the coaxial line 210 is bent into a round shape, inserted into a through hole in the via 204 that is provided for connection to the inner conductor 201, and electrically connected to the pad 206 by a solder body 212 or the like.

A better electrical connection can be achieved by the solder body 212 if it flows into the through hole. The coaxial Line 210 has an outer conductor 213 electrically connected the ground pattern on the uppermost layer of the multilayer circuit board by a solder body 214 or the like for thereby reducing a connection failure. Since the central conductor 211 of the coaxial Line 210 is nearly directly connected to the inner conductor 201 of the stripline, there is achieved a connection that is of excellent high frequency characteristics and provides high matching over a wide frequency range.

Figure 6:
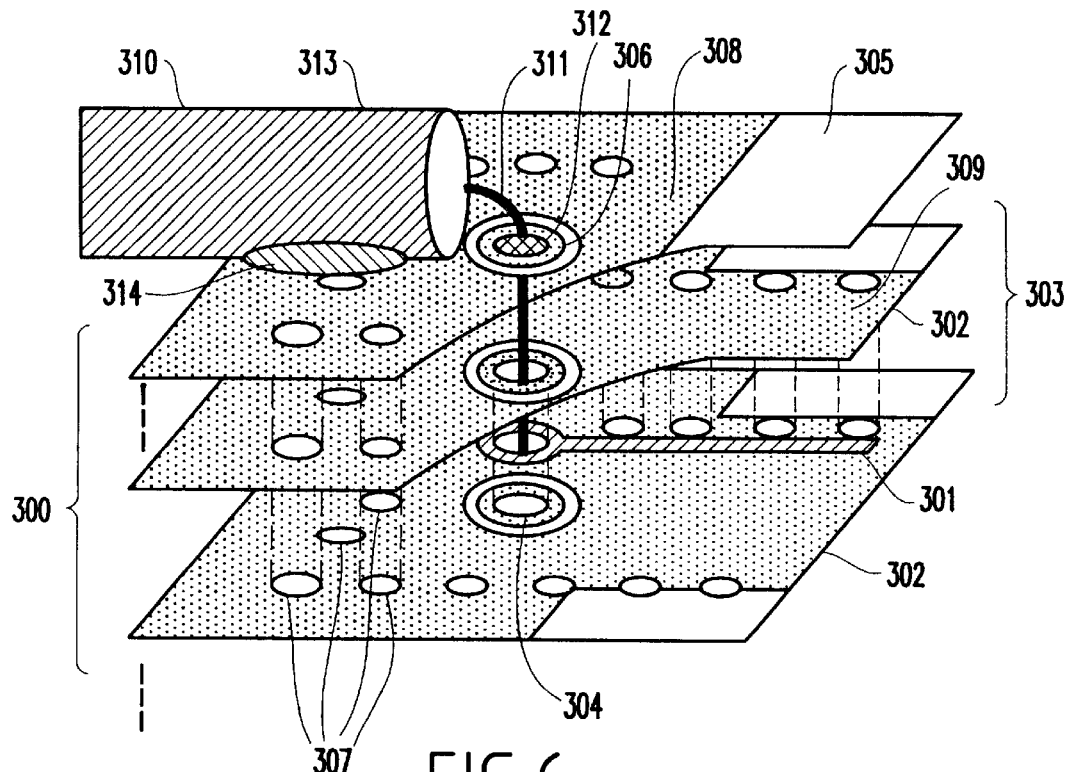
FIG. 6 is an exploded perspective view of a high-frequency circuit according to a third embodiment of the present invention.

FIG. 6 shows in exploded perspective a high-frequency circuit according to a third embodiment of the present invention. The high-frequency circuit according to the third embodiment is directed to a structure in which the stripline according to the first embodiment and a coaxial line are connected to each other.

As shown in FIG. 6, the high-frequency circuit has an inner conductor 301 disposed on an unexposed layer of a multilayer circuit board 300 which comprises at least four layers, and ground patterns 302 disposed above and below the inner conductor 301 with insulators interposed therebetween, thus providing a triplate stripline 303.

The inner conductor 301 has a longitudinal end electrically connected through a via 304 to a pad 306 on an uppermost layer 305. Similarly, the inner ground layer 302 has a longitudinal end electrically connected through vias 307 to a pad 308 on the uppermost layer 305. In order to increase the shielding capability for the inner conductor 301, the vias 307 are provided in a plurality around the via 304 of the inner conductor 301.

The present embodiment resides in that the uppermost layer 305 of the multilayer circuit board and the layer of the stripline on which the ground pattern 309 is formed are not the same layer, but there is another layer between them. A coaxial line 310 has an outer conductor and an insulator removed for a suitable length from a longitudinal tip end thereof, leaving only a central conductor 311. The coaxial line 310 comprises a semirigid coaxial cable, for example. The coaxial line 310 is placed on and parallel to the uppermost layer 305 of the multilayer circuit board.

The tip end of the central conductor 311 of the coaxial line 310 is bent into a round shape, inserted into the via 304 that is provided for connection to the inner conductor. 301, and electrically connected to the pad 306 by a solder body 312 or the like. A better electrical connection can be achieved by the solder body 312 if it flows into the through hole. The coaxial line 310 has an outer conductor 313 electrically connected the ground pad 308 on the uppermost layer 305 of the multilayer circuit board by a solder body 314 or the like.

Figure 7:
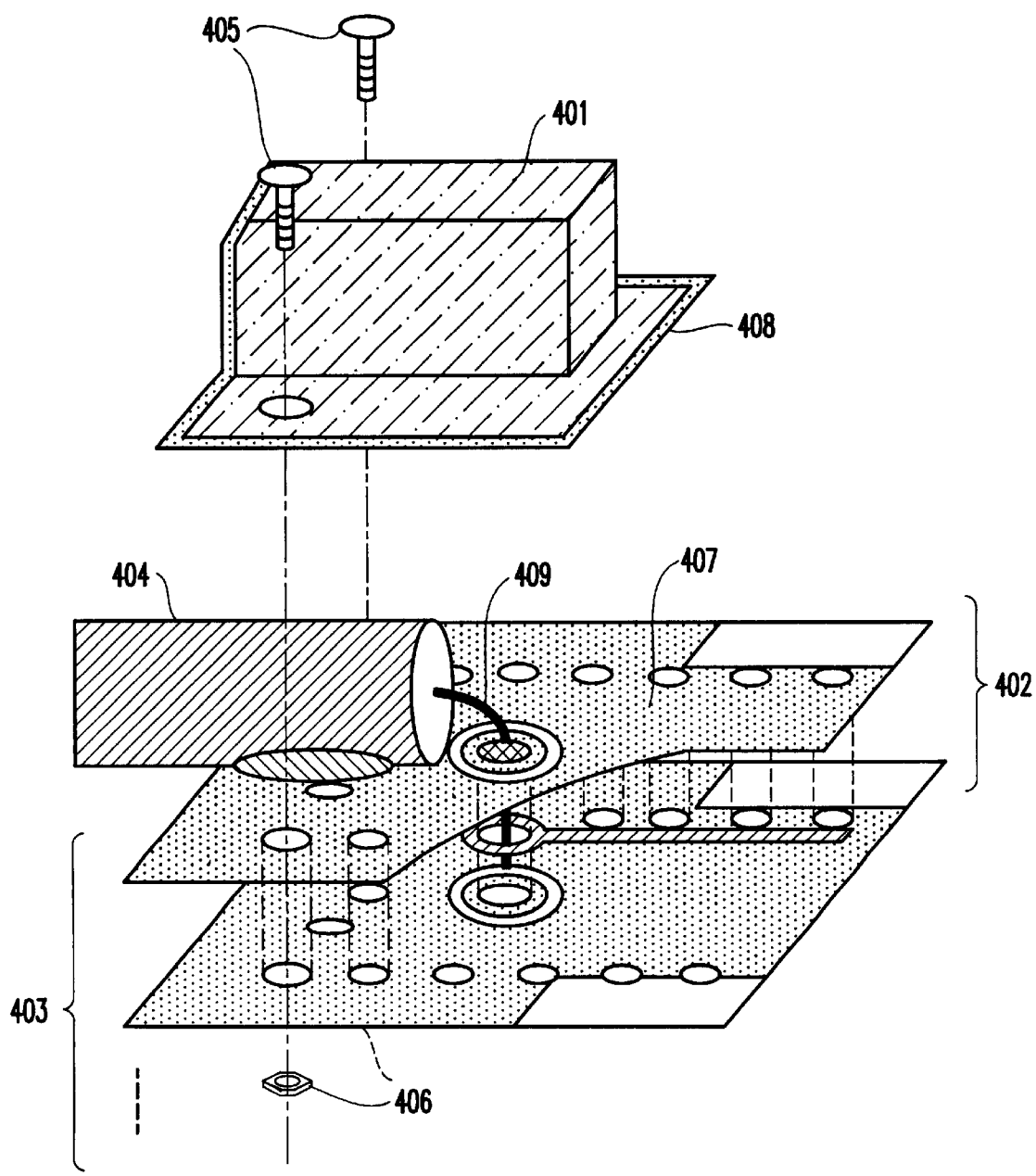
FIG. 7 is an exploded perspective view of a high-frequency circuit according to a fourth embodiment of the present invention.

FIG. 7 shows in exploded perspective a high-frequency circuit according to a fourth embodiment of the present invention. The high-frequency circuit according to the fourth embodiment is concerned with an increased shield for the exposed central conductor of the coaxial line in the second embodiment of the present invention.

In order to increase the shielding capability of the structure in which the stripline and the coaxial line are connected to each other according the second embodiment, a metal casing 401 that can be soldered or a casing 401 made of metal that can be soldered and having a surface film such as a plated film (hereinafter referred to as "metal casing") covers the junction between the stripline and the coaxial line. The metal casing 401 may comprise a casing of copper, for example.

The junction between a multilayer circuit board 403 with a stripline 402 thereon and a coaxial line 404 is covered with the metal casing 401 in the shape of a rectangular parallelepiped. The metal casing 401 is fastened through at least two areas of opposite sides of the coaxial line 404 to the multilayer circuit board 403 by bolts 405 and nuts 406 in pressing relationship to the coaxial line 404. The metal casing 401 and a pad 407 on the multilayer circuit board 403 have parallel surfaces contacting each other, so that they are well held in close contact with each other.

The metal casing 401 may be electrically connected to the pad 407 by a solder body 408 or the like in surrounding relationship to the central conductor 409. The metal casing 401 is of such a size and structure as to be in electrical contact with the coaxial line 404, and they should be electrically connected to each other by a solder body or the like. While the metal casing 401 is in the shape of a rectangular parallelepiped in FIG. 7, the metal casing 401 may be of an arcuate shape for better close contact with the coaxial line 404 for an increased shielding capability.

Figure 8:
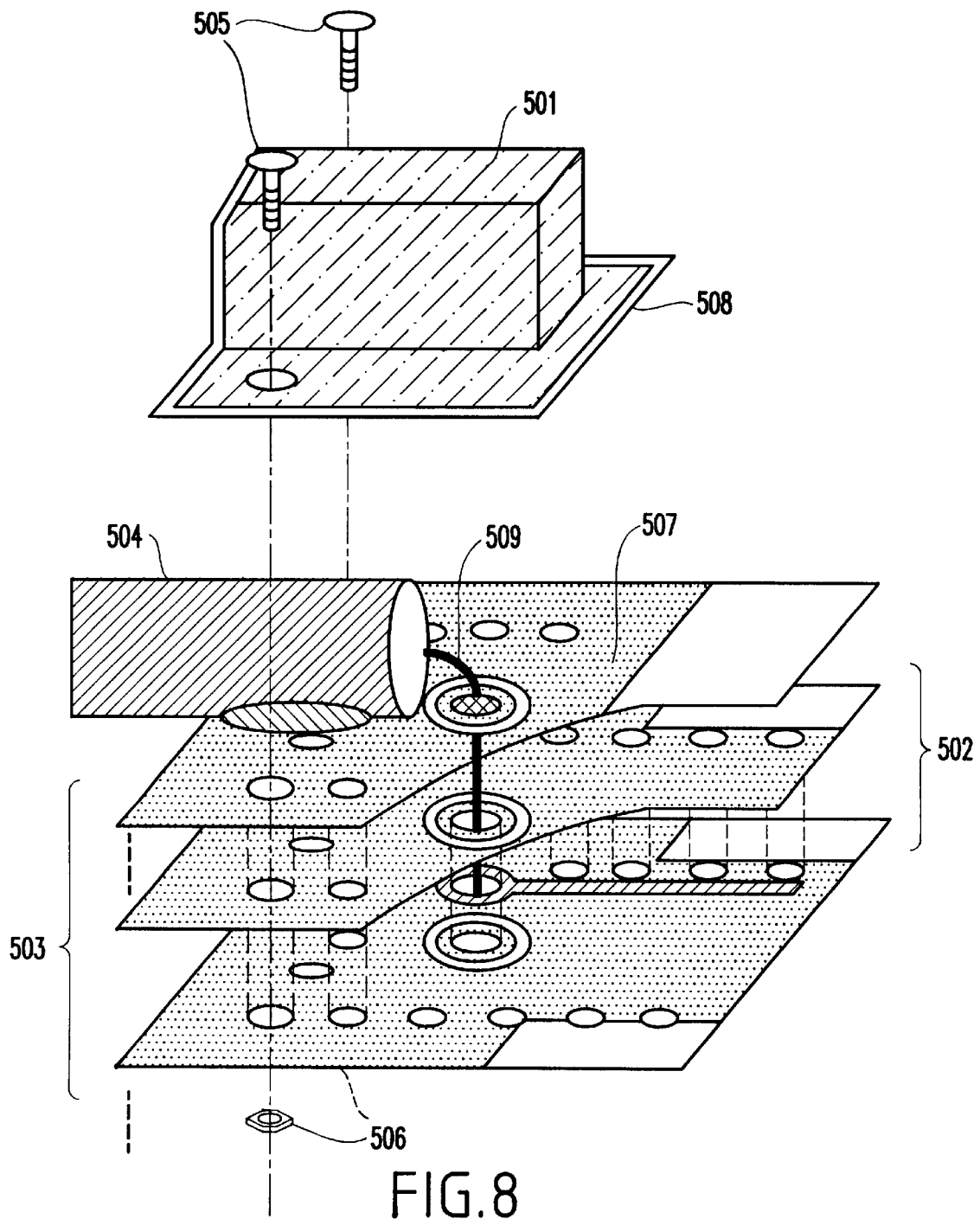
FIG. 8 is an exploded perspective view of a high-frequency circuit according to a fifth embodiment of the present invention.

FIG. 8 shows in exploded perspective a high-frequency circuit according to a fifth embodiment of the present invention. The high-frequency circuit according to the fifth embodiment is concerned with an increased shield for the exposed central conductor of the coaxial line in the third embodiment of the present invention. The high-frequency circuit according to the fifth embodiment is of basically the same structure as the high-frequency circuit according to the fourth embodiment.

As shown in FIG. 8, the junction between a multilayer circuit board 503 with a stripline 502 thereon and a coaxial line 504 is covered with metal casing 501. The metal casing 501 is fastened through at least two areas of opposite sides of the coaxial line 504 to the multilayer circuit board 503 by bolts 505 and nuts 506 in pressing relationship to the coaxial line 504. The metal casing 501 and a pad 407 on the multilayer circuit board 503 have parallel surfaces contacting each other, so that they are well held in close contact with each other.

The metal casing 501 may be electrically connected to the pad 507 by a solder body 508 or the like in surrounding relationship to the central conductor 509. The metal casing 501 is of such a size and structure as to be in electrical contact with the coaxial line 504, and they should be electrically connected to each other by a solder body or the like. While the metal casing 501 is in the shape of a rectangular parallelepiped in FIG. 8, the metal casing 501 may be of an arcuate shape for better close contact with the coaxial line 504 for an increased shielding capability.

Figure 9:
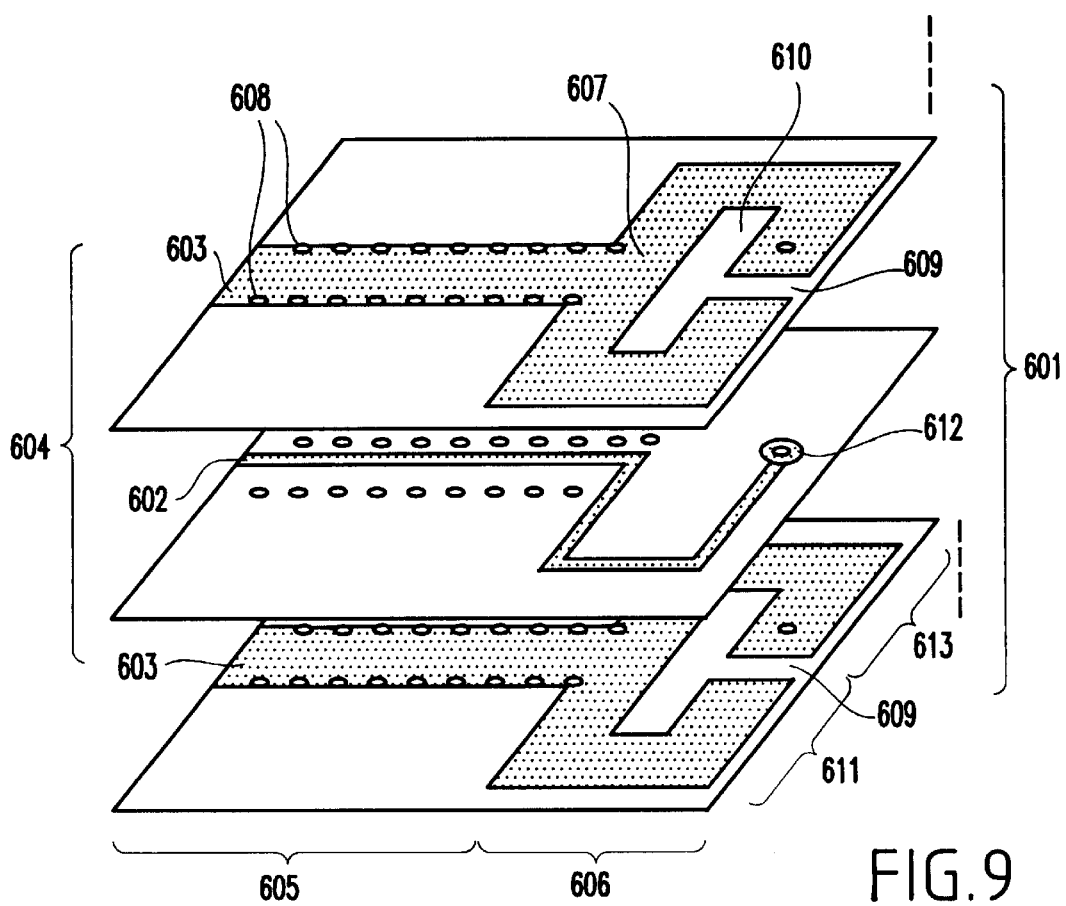
FIG. 9 is an exploded perspective view of a high-frequency circuit according to a sixth embodiment of the present invention.

FIG. 9 shows in exploded perspective a shielded-loop magnetic field detector according to a sixth embodiment of the present invention. The shielded-loop magnetic field detector according to the sixth embodiment employs the stripline structure according to the first embodiment for an increased shielding capability.

As shown in FIG. 9, an inner conductor 602 is disposed on an unexposed layer of a multilayer circuit board 601 which comprises at least three layers, and upper and lower ground patterns 603 are disposed above and below the inner conductor 602 with insulators interposed therebetween, thus providing a triplate stripline 604. An insulator may be disposed on the upper surface of the upper ground pattern, or the lower surface of the lower ground pattern, or both for the purpose of increasing the mechanical strength of the multilayer circuit board 601.

On each of the ground patterns 603, the stripline 604 includes a lead 605 extending as a straight portion from the left end and a loop 606 bent at a right angle into a square shape on a right-hand side of the lead 605. The loop 606 has a terminal end 607 short-circuited to the ground pattern 603 of the stripline 604. The two ground patterns 603 of the leads 605 are electrically short-circuited to each other by vias 608 on opposite transverse ends thereof. The vias 608 are provided in a plurality in the longitudinal direction of the leads 605.

The loop 606 has a square loop opening 610 defined therein and having a gap 609 defined in the right end thereof. The inner conductor 602 has a portion positioned at first half portions 611 of the loops 606, extending across the gaps 609, and electrically connected through a via 612 to the ends of the ground patterns 603 at second half portions 613 of the loops 606.

With the above structure, an output produced by a magnetic field that crosses the loop openings 610 is propagated as a stripline mode to the left ends through the leads 605. In this embodiment, a leakage of the stripline mode from the leads 605 and the effect of ambient noise entering from the leads 605 are reduced, allowing the shielded-loop magnetic field detector to measure a magnetic field highly reliably.

Figure 10A:
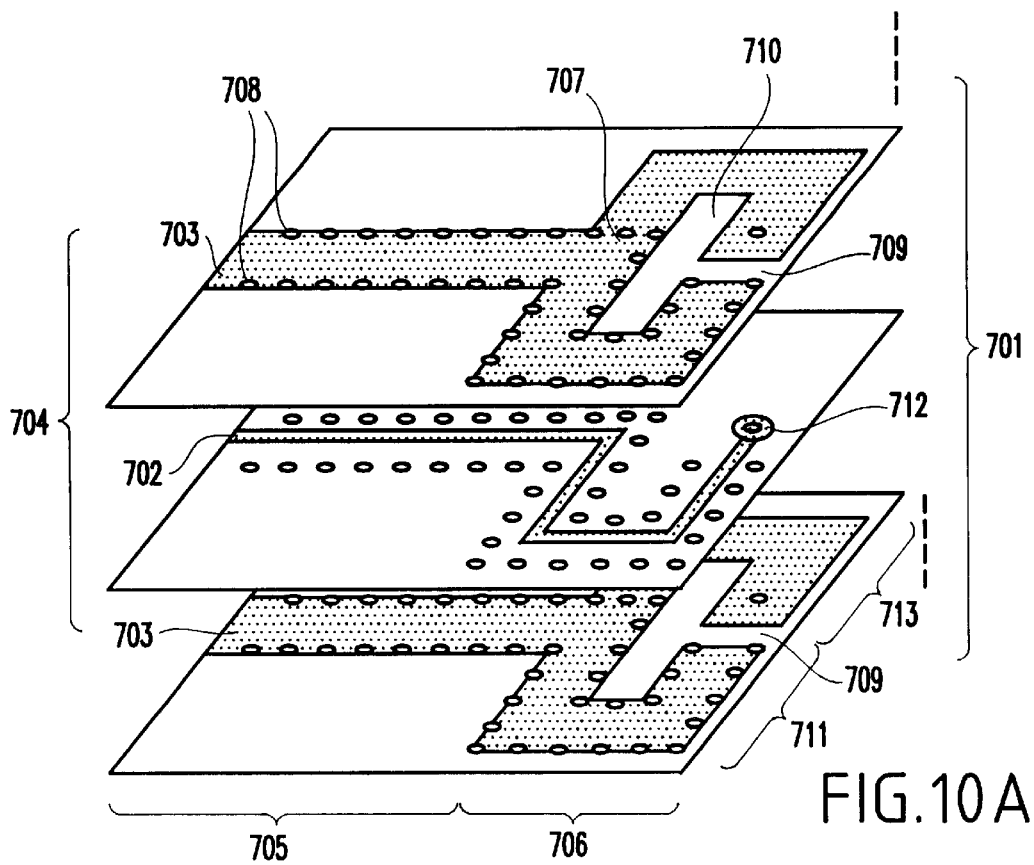
FIGS. 10A and 10B are exploded perspective views of a high-frequency circuit according to a seventh embodiment of the present invention.

FIG. 10A shows in exploded perspective a shielded-loop magnetic field detector according to a seventh embodiment of the present invention. The shielded-loop magnetic field detector according to the seventh embodiment employs the stripline structure according to the first embodiment as applied to the leads and the first half portions of the loops for an increased shielding capability.

As shown in FIG. 10, an inner conductor 702 is disposed on an unexposed layer of a multilayer circuit board 701 which comprises at least three layers, and upper and lower ground patterns 703 are disposed above and below the inner conductor 702 with insulators interposed therebetween, thus providing a triplate stripline 704. An insulator may be disposed on the upper surface of the upper ground pattern, or the lower surface of the lower ground pattern, or both for the purpose of increasing the mechanical strength of the multilayer circuit board 701.

On each of the ground patterns 703, the stripline 704 includes a lead 705 extending as a straight portion from the left end and a loop 706 bent at a right angle into a square shape on a right-hand side of the lead 705. The loop 706 has a terminal end 707 short-circuited to the ground pattern 703 of the stripline 704. The two ground patterns 703 of the leads 705 and first half portions 711 of the loops 706 are electrically short-circuited to each other by vias 708 on opposite transverse ends thereof. The vias 708 are provided in a plurality in the longitudinal direction of the ground patterns 703.

The loop 706 has a gap 709 defined in the right end thereof, and includes a square loop opening 710 defined therein. The inner conductor 702 has a portion positioned at the first half portions 711 of the loops 706, extending across the gaps 709, and electrically connected through a via 712 to the ends of the ground patterns 703 at second half portions 713 of the loops 706. With the above structure, an output produced by a magnetic field that crosses the loop openings 710 is propagated as a stripline mode to the left ends through the leads 705.

Figure 10B:
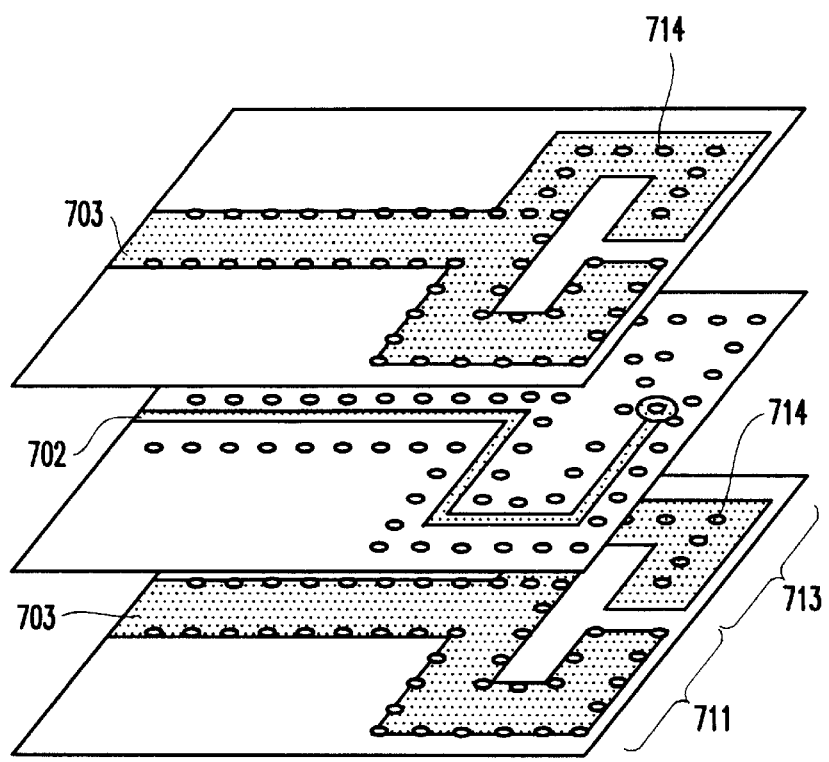

Further, FIG. 10B shows another exploded perspective of a shielded-loop magnetic field detector similar to that of FIG. 10A, wherein two ground patterns 703 at second half portion 713 being free of inner conductor 702 are short-circuited to each other at a transverse center thereof by a plurality of vias 714 arranged along second half portion 713.

In these embodiments, a leakage of the stripline mode from the first half portion 711 of the loops 706 and the leads 705 or the effect of ambient noise entering from the first half portions 711 of the loops 706 and the leads 705 is reduced, allowing the shielded-loop magnetic field detector to measure a magnetic filed more highly reliably.

Figure 11:
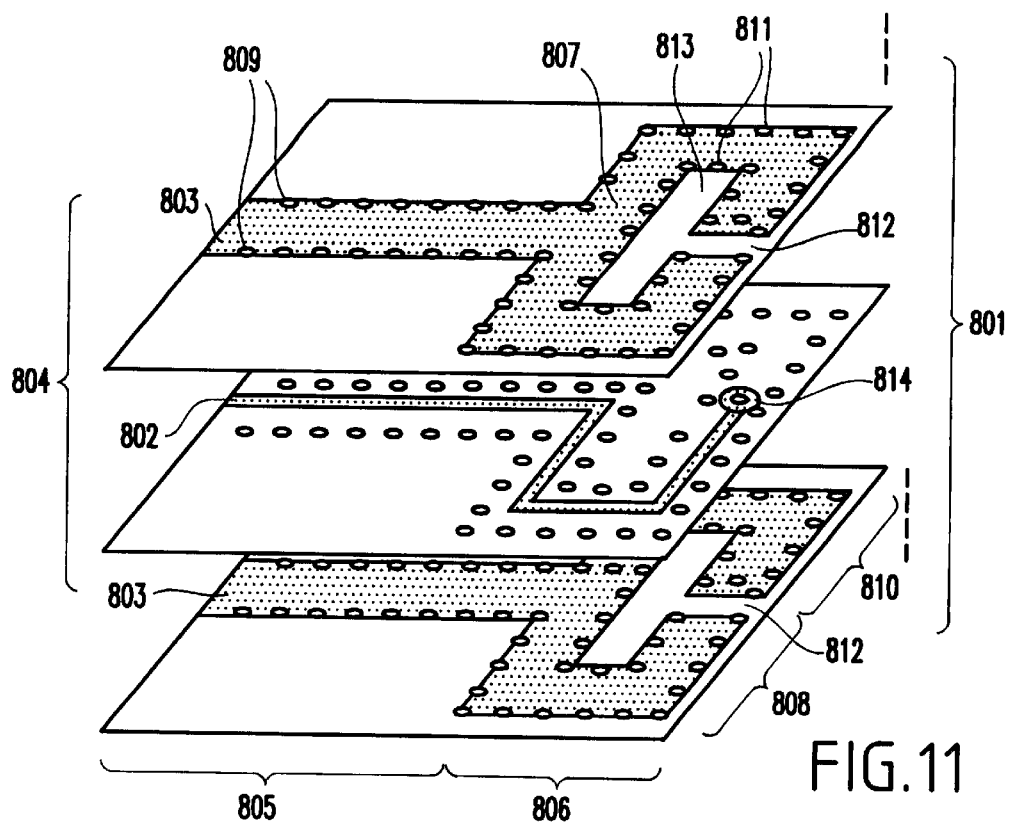
FIG. 11 is an exploded perspective view of a high-frequency circuit according to an eighth embodiment of the present invention.

FIG. 11 shows in exploded perspective a shielded-loop magnetic field detector according to an eighth embodiment of the present invention. The shielded-loop magnetic field detector according to the eighth embodiment employs the stripline structure according to the first embodiment as applied to the leads and the first half portions of the loops and also to the second half portions of the loops for an increased shielding capability.

As shown in FIG. 11, an inner conductor 802 is disposed on an unexposed layer of a multilayer circuit board 801 which comprises at least three layers, and upper and lower ground patterns 803 are disposed above and below the inner conductor 802 with insulators interposed therebetween, thus providing a triplate stripline 804. An insulator may be disposed on the upper surface of the upper ground pattern, or the lower surface of the lower ground pattern, or both for the purpose of increasing the mechanical strength of the multilayer circuit board 801.

On each of the ground patterns 803, the stripline 804 includes a lead 805 extending as a straight portion from the left end and a loop 806 bent at a right angle into a square shape on a right-hand side of the lead 805. The loop 806 has a terminal end 807 short-circuited to the ground pattern 803 of the stripline 804. The two ground patterns 803 of the leads 805 and first half portions 808 of the loops 806 are electrically short-circuited to each other by vias 809 on opposite transverse ends thereof. The vias 809 are provided in a plurality in the longitudinal direction of the ground patterns 803.

Second half portions 810 of the loops 806 are also electrically short-circuited to each other by vias 811 on opposite transverse ends of the two ground patterns 803. The loop 806 has a gap 812 defined in the right end thereof, and includes a square loop opening 813 defined therein. The inner conductor 802 has a portion positioned at the first half portions 808 of the loops 806, extending across the gaps 812, and electrically connected through a via 814 to the ends of the ground patterns 803 at the second half portions 810. With the above structure, an output produced by a magnetic field that crosses the loop openings 813 is propagated as a stripline mode to the left ends.

In this embodiment, a leakage of the stripline mode from the stripline and the effect of ambient noise entering from the stripline are reduced, allowing the shielded-loop magnetic field detector to measure a magnetic field more highly reliably. If there is a magnetic field generating source having a complex radiated electromagnetic field on the right-hand side of the magnetic field detector and the magnetic field detector is positioned closely to the magnetic field generating source, then the magnetic field detector can detect a desired magnetic field only while suppressing the effect of the unwanted electromagnetic field, and hence can measure a magnetic field highly reliably.

According to the present embodiment, furthermore, since the two ground patterns are short-circuited through the vias 811 on the opposite ends of the second half portions 810 that are free of inner conductors, the impedance of the ground patterns is reduced for stable magnetic field measurement. The magnetic field detector is free of characteristics deterioration which would otherwise be caused by an unwanted mode produced by an unwanted electromagnetic field entering between the two ground patterns.

Figure 12:
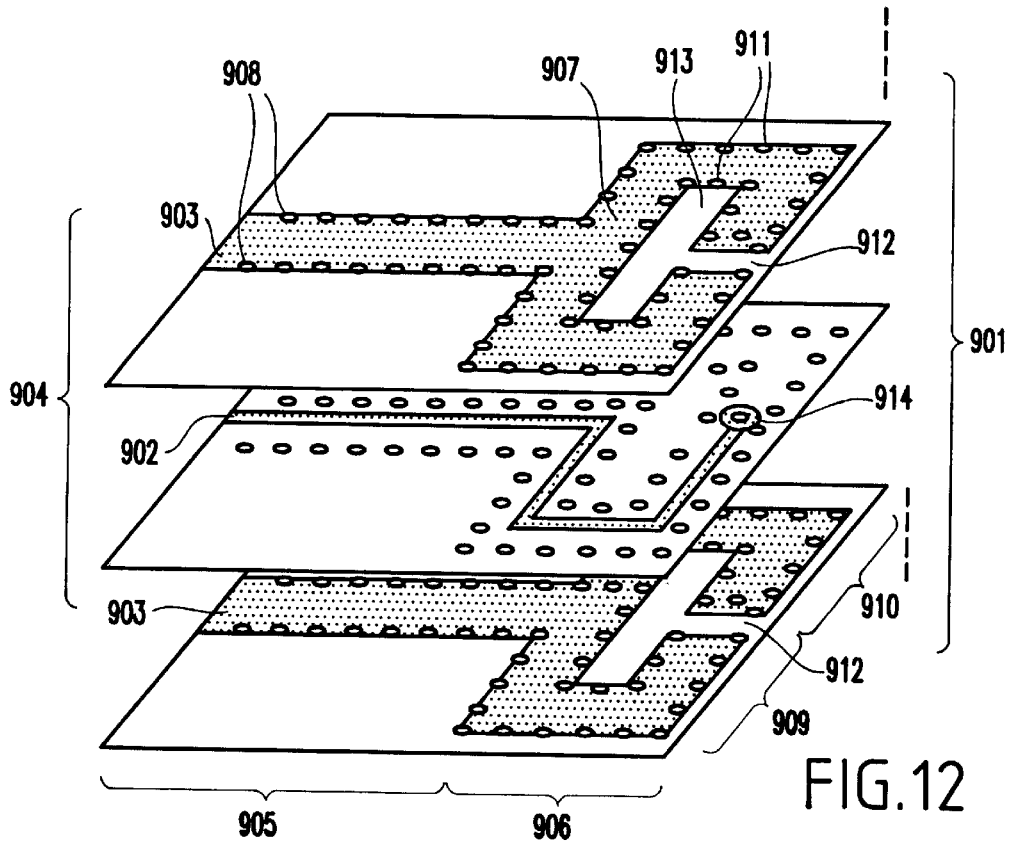
FIG. 12 is an exploded perspective view of a high-frequency circuit according to a ninth embodiment of the present invention.

FIG. 12 shows in exploded perspective a shielded-loop magnetic field detector according to a ninth embodiment of the present invention. The shielded-loop magnetic field detector according to the ninth embodiment employs the stripline structure according to the first embodiment as applied to the leads and the first and second half portions of the loops for an increased shielding capability.

As shown in FIG. 12, an inner conductor 902 is disposed on an unexposed layer of a multilayer circuit board 901 which comprises at least three layers, and upper and lower ground patterns 903 are disposed above and below the inner conductor 902 with insulators interposed therebetween, thus providing a triplate stripline 904. An insulator may be disposed on the upper surface of the upper ground pattern, or the lower surface of the lower ground pattern, or both for the purpose of increasing the mechanical strength of the multilayer circuit board 901.

On each of the ground patterns 903, the stripline 904 includes a lead 905 extending as a straight portion from the left end and a loop 906 bent at a right angle into a square shape on a right-hand side of the lead 905. The loop 906 has a terminal end 907 short-circuited to the ground pattern 903 of the stripline 904 through vias 908. The vias 908 are provided in a plurality in the longitudinal direction of the ground patterns 903. The two ground patterns 903 of first half portions 909 and second half portions 910 of the loops 906 are electrically short-circuited to each other by vias 911 on opposite transverse ends, thereof.

The loop 906 has a gap 912 defined in the right end thereof, and includes a square loop opening 913 defined therein. The inner conductor 902 has a portion positioned at the first half portions 909 of the loops 906, extending across the gaps 912, and electrically connected through a via 914 to the ends of the ground patterns 903 at the second half portions 910. With the above structure, an output produced by a magnetic field that crosses the loop openings 913 is propagated as a stripline mode to the left ends.

In this embodiment, a leakage of the stripline mode from the stripline and the effect of ambient noise entering from the stripline are reduced, allowing the shielded-loop magnetic field detector to measure a magnetic field more highly reliably. If there is a magnetic field generating source having a complex radiated electromagnetic field on the right-hand side of the magnetic field detector and the magnetic field detector is positioned closely to the magnetic field generating source, then the magnetic field detector can detect a desired magnetic field only while suppressing the effect of the unwanted electromagnetic field, and hence can measure a magnetic field highly reliably.

Furthermore, since the two ground patterns are short-circuited through the vias 911 on the opposite ends of the second half portions 910 that are free of inner conductors, the impedance of the ground patterns is reduced for stable magnetic field measurement. The magnetic field detector is free of characteristics deterioration which would otherwise be caused by an unwanted mode produced by an unwanted electromagnetic field entering between the two ground patterns.

Figure 13:
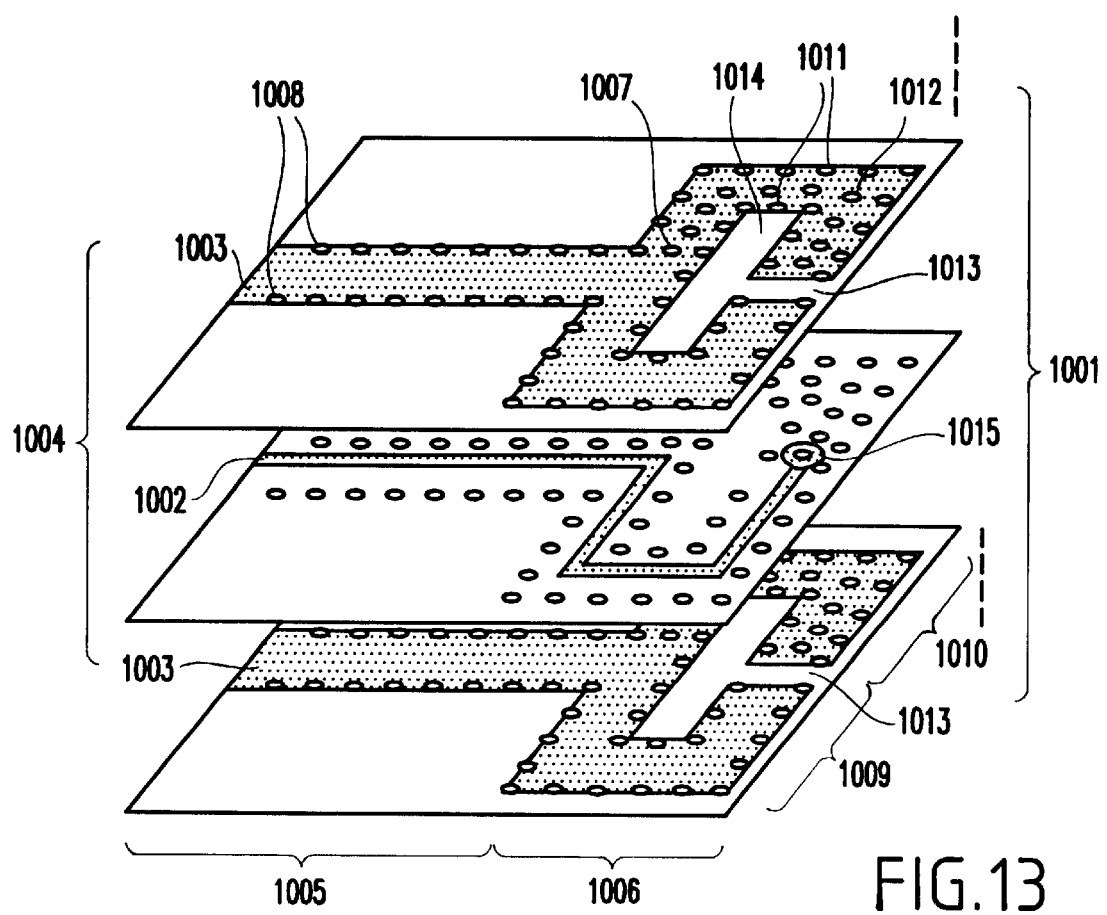
FIG. 13 is an exploded perspective view of a high-frequency circuit according to a tenth embodiment of the present invention.

FIG. 13 shows in exploded perspective a shielded-loop magnetic field detector according to a tenth embodiment of the present invention. The shielded-loop magnetic field detector according to the tenth embodiment employs the stripline structure according to the first embodiment as applied to the leads and the first and second half portions of the loops and has the second half portions short-circuited at their transverse centers through vias, for an increased shielding capability. While the principles of the tenth embodiment are applicable to the sixth through ninth embodiments, they are applied to the ninth embodiment in the illustrated tenth embodiment.

As shown in FIG. 13, an inner conductor 1002 is disposed on an unexposed layer of a multilayer circuit board 1001 which comprises at least three layers, and upper and lower ground patterns 1003 are disposed above and below the inner conductor 1002 with insulators interposed therebetween, thus providing a triplate stripline 1004. An insulator may be disposed on the upper surface of the upper ground pattern, or the lower surface of the lower ground pattern, or both for the purpose of increasing the mechanical strength of the multilayer circuit board 1001.

On each of the ground patterns 1003, the stripline 1004 includes a lead 1005 extending as a straight portion from the left end and a loop 1006 bent at a right angle into a square shape on a right-hand side of the lead 1005. The loop 1006 has a terminal end 1007 short-circuited to the ground pattern 1003 of the stripline 1004. The two ground patterns 1003 of the leads 1005 are electrically short-circuited to each other by vias 1008 on opposite transverse ends thereof. The vias 1008 are provided in a plurality in the longitudinal direction of the ground patterns 1003.

The two ground patterns 1003 of first half portions 1009 and second half portions 1010 of the loops 1006 are electrically short-circuited to each other by vias 1011 on opposite transverse ends thereof. The vias 1011 are provided in a plurality in the longitudinal direction of the ground patterns 1003. The two ground patterns 1003 of second half portions 1009 of the loops 1006 that are free of inner conductors are electrically short-circuited at their transverse centers to each other by vias 1012 on opposite transverse ends thereof. The vias 1012 are provided in a plurality in the longitudinal direction of the ground patterns 1003.

The loop 1006 has a gap 1013 defined in the right end thereof, and includes a square loop opening 1014 defined therein. The inner conductor 1002 has a portion positioned at the first half portions 1009 of the loops 1006, extending across the gaps 1013, and electrically connected through a via 1015 to the ends of the ground patterns 1003 at the second half portions 1010. With the above structure, an output produced by a magnetic field that crosses the loop openings 1014 is propagated as a stripline mode to the left ends.

In this embodiment, a leakage of the stripline mode from the stripline and the effect of ambient noise entering from the stripline are reduced, allowing the shielded-loop magnetic field detector to measure a magnetic field more highly reliably. If there is a magnetic field generating source having a complex radiated electromagnetic field on the right-hand side of the magnetic field detector and the magnetic field detector is positioned closely to the magnetic field generating source, then the magnetic field detector can detect a desired magnetic field only while suppressing the effect of the unwanted electromagnetic field, and hence can measure a magnetic field highly reliably.

Furthermore, since the two ground patterns are short-circuited through the vias 1011, 1012 on the opposite ends and centers of the second half portions 1010 that are free of inner conductors, the impedance of the ground patterns is reduced for stable magnetic field measurement. The magnetic field detector is free of characteristics deterioration which would otherwise be caused by an unwanted mode produced by an unwanted electromagnetic field entering between the two ground patterns.

According to the present invention, the shielding capability of the triplate stripline is increased, and electromagnetic interference between the stripline and adjacent circuit components or another stripline, and the effect of ambient electromagnetic noise can be reduced.

Although certain preferred embodiments of the present invention have been shown and described in detail, it should be understood that various changes and modifications may be made therein without departing from the scope of the appended claims.

What is claimed is:

1. A high-frequency circuit, including a triplate stripline on a multilayer circuit board, said triplate stripline, comprising:

a single inner conductor disposed on an unexposed layer of said multilayer circuit board;

two ground patterns sandwiching said single inner conductor, each of said two ground patterns having a width greater than a width of said single inner conductor; and a plurality of vias disposed in a signal transmitting direction of said triplate stripline and short-circuiting said two ground patterns on opposite transverse ends of said two ground patterns, wherein only said single inner conductor is surrounded by said two ground patterns and said plurality of vias on opposite transverse ends of said two ground patterns when viewed in a cross section that includes a transverse pair of said plurality of vias.

2. A high-frequency circuit according to claim 1, wherein said width of each of said two ground patterns is 10 times said width of said single inner conductor or less.

3. A high-frequency circuit according to claim 1, further comprising:

a coaxial line disposed on an uppermost layer of said multilayer circuit board, said coaxial line comprising a central conductor exposed from a tip end thereof, which is inserted into a through hole of a via located in said uppermost layer of said multilayer circuit board and is electrically connected to said single inner conductor of said triplate stripline;

a solder body that electrically connects said central conductor and said single inner conductor; and an outer conductor of said coaxial line exposed near said tip end thereof and electrically connected by solder to a metal pattern that is electrically connected to said two ground patterns of said triplate stripline.

4. A high-frequency circuit according to claim 2, further comprising:

a coaxial line disposed on an uppermost layer of said multilayer circuit board, said coaxial line comprising a central conductor exposed from a tip end thereof, which is inserted into a through hole of a via located in said uppermost layer of said multilayer circuit board and is electrically connected to said single inner conductor of said triplate stripline;

a solder body that electrically connects said central conductor and said single inner conductor; and an outer conductor of said coaxial line exposed near said tip end thereof and electrically connected by solder to a metal pattern that is electrically connected to said two ground patterns of said triplate stripline.

5. A high-frequency circuit according to claim 3, further comprising a metal casing that covers a portion of an upper ground pattern of said two ground patterns and said central conductor that is exposed on said uppermost layer of said multilayer circuit board, said metal casing being electrically connected to said upper ground pattern of said triplate stripline and said outer conductor of said coaxial line by a solder body and being fastened to said multilayer circuit board from opposite sides thereof by a bolt and a nut.

6. A high-frequency circuit according to claim 4, further comprising a metal casing that covers a portion of an upper ground pattern of said two ground patterns and said central conductor on said uppermost layer of said multilayer circuit board, said metal casing being electrically connected to said upper ground pattern of said triplate stripline and said outer conductor of said coaxial line by a solder body and being fastened to said multilayer circuit board from opposite sides thereof by a bolt and a nut.

7. A high-frequency circuit according to claim 1, wherein said plurality of vias are disposed at a pitch of $1/6$ or less of a wavelength of transmitted signals.

8. A shielded-loop magnetic field detector, comprising:

a lead including first parts of two ground patterns;

a loop including second parts of said two ground patterns that are connected to said lead, said loop surrounding an opening and having a gap opposite to said lead; and a single inner conductor insulated from said two ground patterns and extending from an end of said lead to another end of said lead connected to said loop, through a first half portion of said loop, across said gap, and to a second half portion of said loop, wherein said lead comprises a triplate stripline, including:

said single inner conductor extending from said end of said lead to said another end of said lead connected to said loop and disposed on an unexposed layer of a multilayer circuit board;

said first parts of said two ground patterns sandwiching only said single inner conductor, each of said two ground patterns having a width greater than a width of said single inner conductor; and a plurality of vias disposed in a signal transmitting direction of said triplate stripline and short-circuiting said first parts of said two ground patterns on opposite transverse ends of said first parts, wherein said single inner conductor is surrounded by said first parts of said two ground patterns and said plurality of vias on opposite transverse ends of said first parts when viewed in a cross section that includes a transverse pair of said plurality of vias, such that an output produced by a magnetic field crossing said opening of said loop is propagated as a stripline mode to said lead.

9. A shielded-loop magnetic field detector according to claim 8, wherein said width of each of said two ground patterns is 10 times said width of said single inner conductor or less.

10. A shielded-loop magnetic field detector according to claim 8, wherein said lead and said loop comprise a triplate stripline, said triplate stripline, including:

said single inner conductor disposed on an unexposed layer of a multilayer circuit board;

said two ground patterns sandwiching only said single inner conductor, each of said two ground patterns having a width greater than a width of said single inner conductor; and a plurality of vias located along peripheral edges of said two ground patterns on opposite transverse ends so as to short-circuit said two ground patterns, wherein said single inner conductor is surrounded by said two ground patterns and said plurality of vias on opposite transverse ends of said two ground patterns when viewed in a cross section including a pair of said plurality of vias, such that an output produced by a magnetic field crossing said opening of said loop is propagated as a stripline mode to said lead.

11. A shielded-loop magnetic field detector according to claim 9, wherein said lead and said loop comprise a triplate stripline, said triplate stripline, including:

said single inner conductor disposed on an unexposed layer of a multilayer circuit board;

said two ground patterns sandwiching only said single inner conductor, each of said two ground patterns having a width greater than a width of said single inner conductor; and a plurality of vias located along peripheral edges of said two ground patterns on opposite transverse ends so as to short-circuit said two ground patterns, wherein said single inner conductor is surrounded by said two ground patterns and said plurality of vias on opposite transverse ends of said two ground patterns when viewed in a cross section including a pair of said plurality of vias, such that an output produced by a magnetic field crossing said opening of said loop is propagated as a stripline mode to said lead.

12. A shielded-loop magnetic field detector according to claim 10, wherein said plurality of vias includes another plurality of vias that short-circuits said second half portions of said loop of said two ground patterns, said another plurality of vias being centered transversely along said second half portions.

13. A shielded-loop magnetic field detector according to claim 11, wherein said plurality of vias includes another plurality of vias that short-circuits said second half portions of said loop of said two ground patterns, said another plurality of vias being centered transversely along said second half portions.

14. A shielded-loop magnetic field detector according to claim 8, wherein said plurality of vias are disposed at a pitch of ⅙ or less of a wavelength of transmitted signals.

15. A shielded-loop magnetic field detector, comprising:

a lead including first parts of two ground patterns;

a loop including second parts of said two ground patterns that are connected to said lead, each of said second parts further including a first half portion and a second half portion of said loop, and said loop surrounding an opening and having a gap opposite to said lead; and a single inner conductor insulated from said two ground patterns and extending from an end of said lead to another end of said lead connected to said loop, through said first half portion of said loop, across said gap, and to said second half portion of said loop, wherein said lead and said first half portion of said loop comprise a triplate stripline, said triplate stripline, including:

said single inner conductor extending from said end of said lead to said another end of said lead connected to said loop and through said first portion of said loop and disposed on an unexposed layer of a multilayer circuit board;

said first parts of said two ground patterns sandwiching only said single inner conductor, each of said two ground patterns having a width greater than a width of said single inner conductor; and a plurality of vias disposed in a signal transmitting direction of said triplate stripline and short-circuiting said first parts, corresponding to said lead, and said first portions of said loop of said two ground patterns on opposite transverse ends of said first parts and said first portions, wherein said single inner conductor is surrounded by said first parts and said first portions of said two ground patterns and said plurality of vias on opposite transverse ends of said first parts and said first portions when viewed in a cross section that includes a pair of said plurality of vias, such that an output produced by a magnetic field crossing said opening of said loop is propagated as a stripline mode to said lead.

16. A shielded-loop magnetic field detector according to claim 15, wherein said width of each of said two ground patterns is 10 times said width of said single inner conductor or less.

17. A shielded-loop magnetic field detector according to claim 15, wherein said plurality of vias includes another plurality of vias that short-circuits said second half portions of said loop of said two ground patterns on opposite transverse ends of said second half portions.

18. A shielded-loop magnetic field detector according to claim 16, wherein said plurality of vias includes another plurality of vias that short-circuits said second half portions of said loop of said two ground patterns on opposite transverse ends of said second half portions.

19. A shielded-loop magnetic field detector according to claim 15, wherein said plurality of vias includes another plurality of vias that short-circuits said second half portions of said loop of said two ground patterns, said another plurality of vias being centered transversely along said second half portions.

20. A shielded-loop magnetic field detector according to claim 16, wherein said plurality of vias includes another plurality of vias that short-circuits said second half portions of said loop of said two ground patterns, said another plurality of vias being centered transversely along said second half portions.

21. A shielded-loop magnetic field detector according to claim 15, wherein said plurality of vias are disposed at a pitch of ⅙ or less of a wavelength of transmitted signals.

* * * * *